(12) United States Patent
McKiel, Jr.

(10) Patent No.: US 7,894,615 B1
(45) Date of Patent: Feb. 22, 2011

(54) ATTENUATOR DEVICE FOR AMPLIFIED MUSICAL INSTRUMENTS

(76) Inventor: Frank Albert McKiel, Jr., 1211 Whitenhouse Dr., Colorado Springs, CO (US) 80904

( * ) Notice: Subject to any disclaimer, the term of this patent is extended or adjusted under 35 U.S.C. 154(b) by 1426 days.

(21) Appl. No.: 11/323,030

(22) Filed: Dec. 30, 2005

(51) Int. Cl.
*H03G 3/00* (2006.01)
*H03F 99/00* (2009.01)

(52) U.S. Cl. .................. 381/109; 381/120; 330/284
(58) Field of Classification Search ............. 381/120, 381/109, 104, 106, 118; 330/284
See application file for complete search history.

(56) References Cited

U.S. PATENT DOCUMENTS

| | | | | |
|---|---|---|---|---|
| 4,438,415 A | * | 3/1984 | Hopfer | 333/81 A |
| 4,959,867 A | * | 9/1990 | Lutz | 381/107 |
| 5,814,752 A | * | 9/1998 | Rivera | 84/711 |
| 2003/0103633 A1 | * | 6/2003 | Metcalfe, III | 381/77 |

* cited by examiner

*Primary Examiner*—Vivian Chin
*Assistant Examiner*—Paul Kim

(57) ABSTRACT

An apparatus is provided for attenuating electrical signals in the signal path of an electronic audio frequency amplifier for amplifying signals from musical instruments. In accordance with a preferred embodiment, the apparatus is configured to be coupled to the amplifier in more than one arrangement and the apparatus exhibits different attenuation characteristics depending on which arrangement is used to couple the apparatus to the amplifier.

5 Claims, 11 Drawing Sheets

FIG. 1
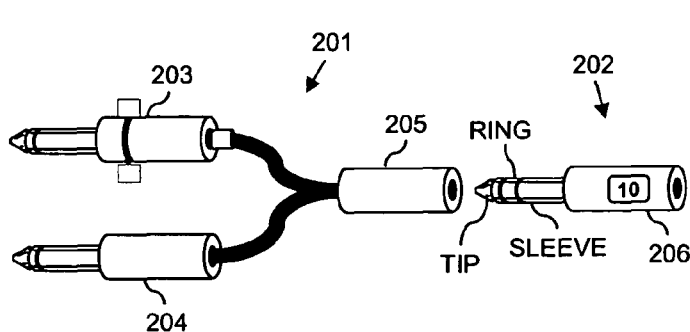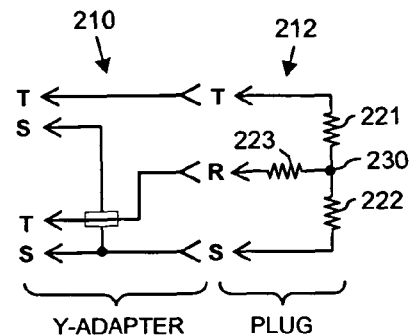
FIG. 2
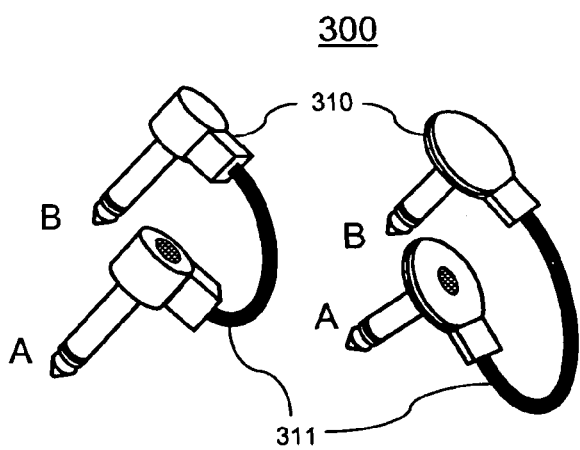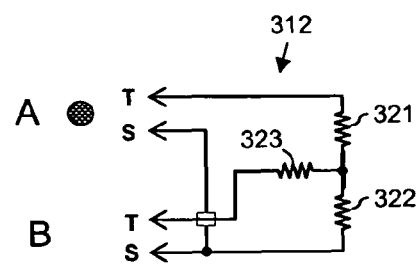
FIG. 3

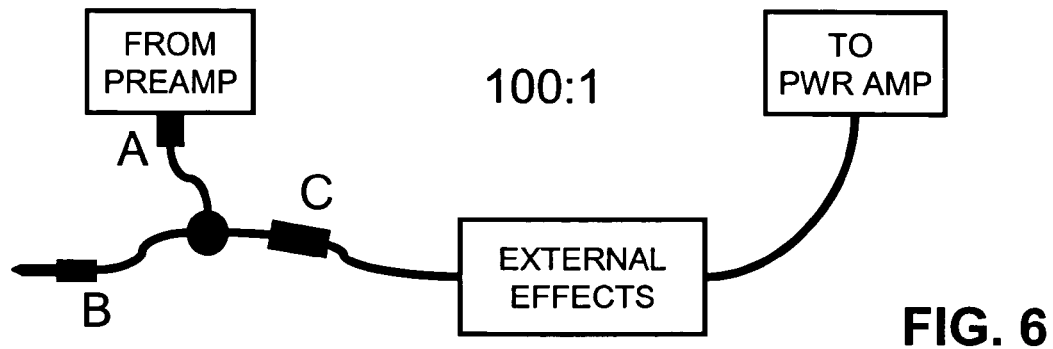
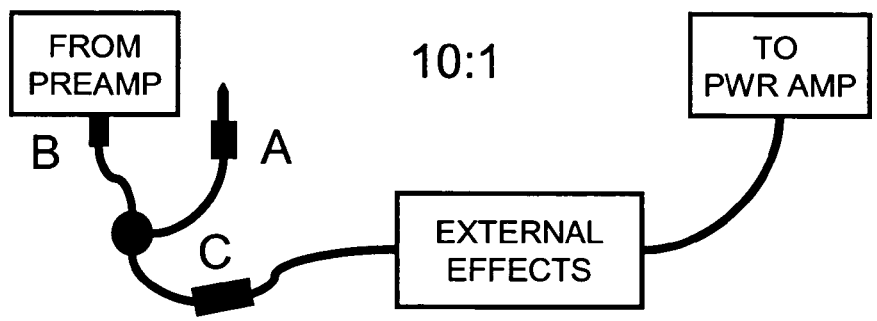
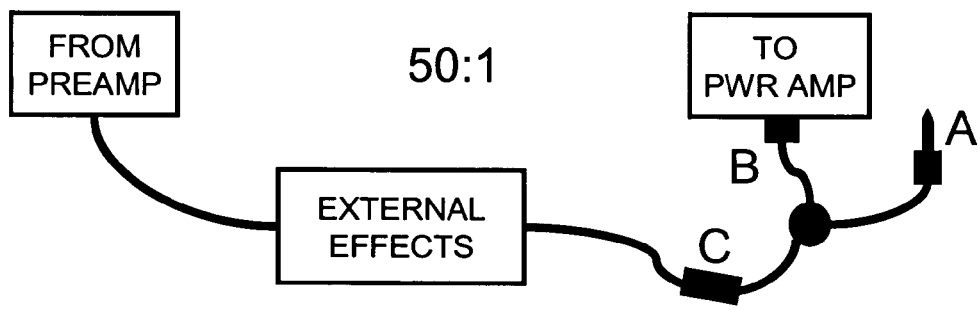
FIG. 6
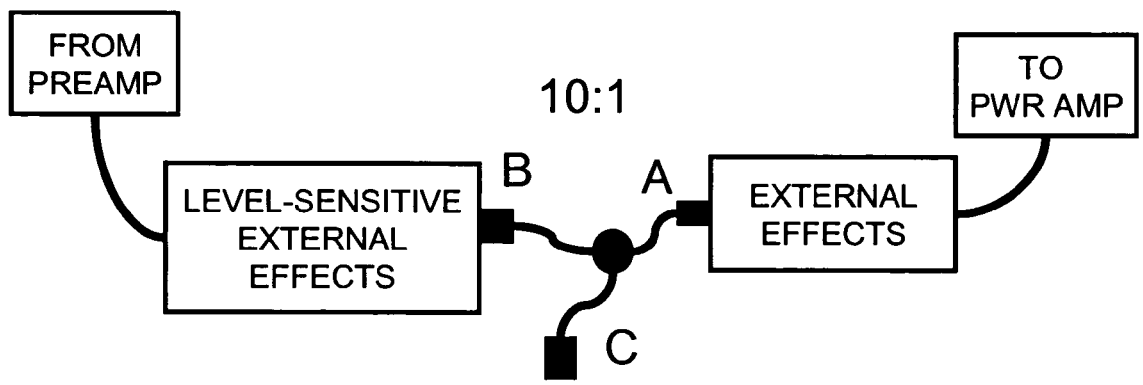

FIG. 8

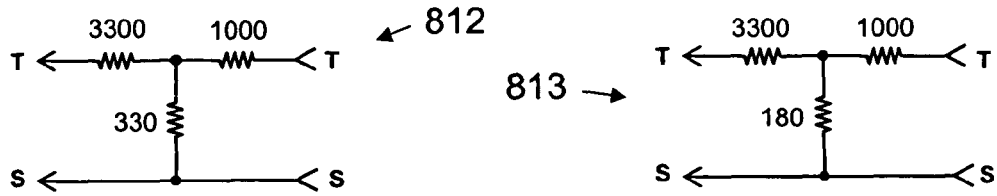

| CONFIGURATION | APPROX. RATIO |
|---|---|
| FROM PREAMP → A → CABLE → TO PWR AMP. | 11:1 |
| FROM PREAMP → B → CABLE → TO PWR AMP. | 19:1 |
| FROM PREAMP → CABLE → A → TO PWR AMP. | 4:1 |
| FROM PREAMP → CABLE → B → TO PWR AMP. | 7:1 |
| FROM PREAMP → A → B → CABLE → TO PWR AMP. | 68:1 |
| FROM PREAMP → B → A → CABLE → TO PWR AMP. | 38:1 |
| FROM PREAMP → CABLE → A → B → TO PWR AMP. | 55:1 |
| FROM PREAMP → CABLE → B → A → TO PWR AMP. | 31:1 |
| FROM PREAMP → A → CABLE → B → TO PWR AMP. | 43:1 |
| FROM PREAMP → B → CABLE → A → TO PWR AMP. | 24:1 |

SIGNAL DIRECTION →

ATTENUATOR DEVICE FOR AMPLIFIED MUSICAL INSTRUMENTS

TECHNICAL FIELD OF THE INVENTION

The present invention relates to electronic amplification for musical instruments and, more particularly, to facilitating control of amplification in a musical instrument amplifier.

BACKGROUND OF THE INVENTION

Many musical instruments such as electric guitars are used in conjunction with electronic amplifiers and other electronic devices to render an audible signal that has a desired sound quality and loudness. Typically, an electric guitar will be used with a guitar amplifier comprising a preamplifier, a power amplifier and one or more speakers, all built into a common cabinet or in a set of cabinets designed to be stacked or used together. Guitar amplifiers are often designed to produce very loud sound output from the speakers. Guitar amplifiers designed for live performances may be rated at power levels of 50 to 100 Watts or even considerably more.

However, a large proportion of guitar amplifiers are used by novice guitar players who desire to use the amplifier for practice purposes and who will often play relatively quietly along with recorded music, training media, etc. Novice players frequently play softly to avoid disturbing other people. As much as possible, it is desirable that the sound level of the guitar playing be controlled to low levels while still maintaining the sound characteristics, such as distortion and tone characteristics, that the combination of the guitar, amplifier and speaker would exhibit at higher volumes. Even very experienced guitar players will often play at low to medium volume levels when not engaged in a live performance, such as when practicing or recording. In yet other instances, a guitar player using an electric guitar may be playing alongside other instruments that are not electronically amplified, such as unamplified acoustic guitars.

With a typical guitar amplifier, it is difficult to control volume at relatively low levels. For example, in the usual case where a volume control knob on a guitar amplifier is labeled to be adjustable from "0" (no output) to "10" (maximum output), adjusting the volume output to a comfortable level may require carefully setting the knob position to somewhere between "0" and "1". Often the adjustment is extremely erratic, meaning that minute adjustments in the position of the knob may cause the volume to jump stepwise rather than smoothly. The volume control knob on a guitar amplifier typically controls a potentiometer in the electronic circuitry of the amplifier. If the potentiometer is dirty or noisy and the contact resistance between the wiper and the resistance element varies as the potentiometer is adjusted, then it is even possible that turning the knob towards a lower setting may cause the volume to actually increase in an erratic fashion. This effect is more pronounced as the knob position approaches the "0" position. With some volume controls, it may not be possible to achieve an arbitrarily chosen desired low volume level.

Even where the volume control potentiometer is 'clean' and volume varies smoothly with movement of the knob coupled to the potentiometer, the range of desirable volume settings are compressed to less than 10% (and often less than 2%) of the available motion of the volume control knob. This may require the user to use extreme finesse in positioning the knob, which makes use of the amplifier more difficult and frustrating. All of these problems persist even where potentiometers are used which employ a logarithmic taper.

Some players naturally attempt to alleviate these problems by simply setting the volume knob on the amplifier to some approximate level and then exercising fine control over the sound volume by using one or more volume control potentiometers on the guitar itself. Unfortunately, this approach has at least two undesirable side effects. Often, distortion or other effects that are to be applied to the guitar's electrical output signal are very dependent upon the signal level coming from the guitar. Reducing the output level from the guitar by using the volume control potentiometer of guitar can dramatically alter many characteristics, other than just volume, of the sound that ultimately comes out of the speaker. For example, turning the guitar output down can dramatically reduce or eliminate the distortion or overdrive that is desired for some types of music. Thus, the user is deprived of being able to hear, at low volumes, the same sound signal that the amplifier would produce at higher volumes. Another problem with using the volume control potentiometer of a guitar to adjust the overall volume of the guitar amplifier combination is that this can alter the frequency response of the guitar, typically causing the high frequencies to be selectively attenuated as the guitar volume is turned down. This is largely due to the inductive characteristics of the guitar pickups, which are essentially wire coils around ferromagnetic cores positioned near the guitar strings to act as transducers. As the volume knob is turned down, the guitar's electrical output signal effectively loses treble content or higher frequency content, resulting in a disappointingly dull sound.

Another solution to this problem that has been proposed involves attenuating the electrical signal between the power amplifier and a speaker, essentially dissipating a large proportion of the amplifier's power output into a resistive dummy load. While this may enable the volume control to be operated in its midrange, most of the large amount of signal power out of the power amplifier is wasted in the form of heat. Devices that operate in this manner are quite expensive, wasteful of electrical power, and, if not designed properly or subject to failure, can damage power amplifier output stages. Components in the output stages are subjected to greater electrical, mechanical or thermal stress and can wear out or fail much faster.

Thus, there is frequent and widespread need to be able to control the volume of instrument amplifiers to enable playing softly or at moderate volumes, even though the amplifier may be capable of producing sounds in excess of 100 decibels.

SUMMARY OF THE INVENTION

The present invention relates to providing attenuation between a preamplifier stage and a power amplifier stage of an instrument amplifier, enabling a volume control coupled to the preamplifier stage to be operated at a different portion of its adjustment range to facilitate finer control of volume at lower volume settings.

In some aspects, the present invention provides for an apparatus configured to be removably coupled to an electronic audio frequency amplifier, the electronic audio frequency amplifier comprising a preamplifier and a power amplifier and having a first electrical connector coupled to the output of the preamplifier and having a second electrical connector coupled to the input of the power amplifier, the apparatus comprising a third electrical connector configured to be electrically coupled to the first electrical connector in accordance with a first usage configuration, a fourth electrical connector configured to be electrically coupled to the second electrical connector in accordance with the first usage configuration, and an electrical attenuator circuit operating to receive an input voltage signal from the preamplifier via the third electrical connector and to provide via the fourth electrical connector an output voltage signal to the power amplifier that is proportional to the input voltage according to a first proportion factor and the first proportion factor is such that the output voltage signal is less than the input voltage signal.

In accordance with other aspects, the present invention provides for an apparatus for attenuating electrical signals comprising a first attenuator device for insertion into a signal path comprising a first electrical connector, a second electrical connector, and a first attenuator network coupled to both the first connector and the second connector such that electrical signals passing between the first and second connectors are attenuated by the first attenuator network; a second attenuator device for insertion into a signal path comprising a third electrical connector, a fourth electrical connector; and a second attenuator network coupled to both the third connector and the fourth connector such that electrical signals passing between the third and fourth connectors are attenuated by the second attenuator network; wherein the attenuation of electrical signals is accomplished by passing the electrical signals through both the first attenuator device and the second attenuator device and wherein the amount of attenuation exhibited by the apparatus is varied by a user selecting whether the electrical signals pass through the first attenuator device and then the second attenuator device or vice versa.

In accordance with yet other aspects, the present invention provides for an apparatus for attenuating electrical signals comprising a first attenuator device for insertion into a signal path comprising a first electrical connector; a second electrical connector, and a first attenuator network coupled to both the first connector and the second connector such that electrical signals passing between the first and second connectors are attenuated by the first attenuator network; a second attenuator device for insertion into a signal path comprising a third electrical connector, a fourth electrical connector, and a second attenuator network coupled to both the third connector and the fourth connector such that electrical signals passing between the third and fourth connectors are attenuated by the second attenuator network; wherein the attenuation of electrical signals is accomplished by passing the electrical signals through both the first attenuator device and the second attenuator device and wherein the first attenuator device is configured to be reversibly connected into the signal path and wherein the amount of attenuation exhibited by the apparatus is varied by the user selecting whether the electrical signals pass from the first electrical connector to the second electrical connector or vice versa.

BRIEF DESCRIPTION OF THE DRAWINGS

The present invention is further illustrated in various exemplary embodiments, which are not to be construed as limiting the scope of the invention and which are more thoroughly explained in the following detailed description in conjunction with the accompanying drawings wherein:

FIG. 1 illustrates a single-connector device configured to attenuate electrical signals in an instrument amplifier in accordance with an example embodiment of the present invention;

FIG. 2 illustrates a multi-connector device employing a jack and configured to attenuate electrical signals in an instrument amplifier in accordance with an example embodiment of the present invention;

FIG. 3 illustrates a two-connector device configured to attenuate electrical signals in an instrument amplifier in accordance with an example embodiment of the present invention;

FIG. 6 depicts a variety of arrangements for accomplishing attenuation of electrical signals employing devices as were shown in FIG. 4;

FIG. 8 illustrates a manner of constructing and using a plurality of attenuation devices in various configurations in accordance with an example embodiment of the present invention;

DETAILED DESCRIPTION OF EXEMPLARY EMBODIMENTS

In the accompanying drawings, FIGS. 1 through 15 depict various physical embodiments and corresponding electrical circuit implementations in accordance with exemplary embodiments of the present invention. As will be demonstrated by example, the present invention may be embodied in a variety of physical configurations and electrical circuit configurations.

As stated before, the present invention relates to providing attenuation between a preamplifier stage and a power amplifier stage of an instrument amplifier, enabling a volume control coupled to the preamplifier stage to be operated at a different portion of its adjustment range to facilitate finer control of volume at lower volume settings.

As described in the background herein, the most often used output levels from an amplifier may involve adjusting the volume control using only a few percent of its range. By the use of an attenuator between preamplifier and power amplifier in accordance with the present teachings, a desirable range of volume levels may utilize 20% to 100% of the volume control's range, dramatically facilitating fine control of volume level and more evenly distributing wiper wear inside the volume control potentiometer.

Figure 16:
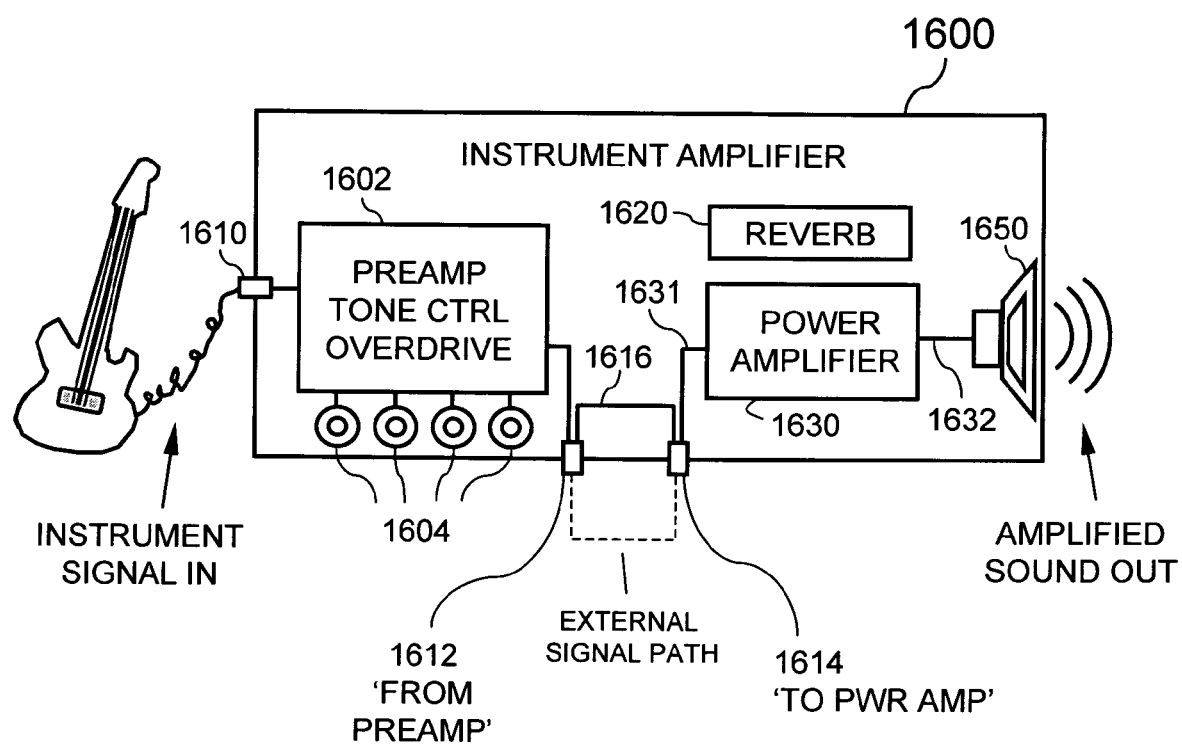
FIG. 16 illustrates the typical components and operation of an instrument amplifier as an example context wherein the present invention may find use.

For explaining a typical context for the use of the present invention, FIG. 16 depicts a conventional instrument amplifier 1600, which is an electronic audio frequency amplifier used for receiving an electrical input signal from a musical instrument, such as electric guitar, and creating an amplified sound output based on the electrical input signal. Instrument amplifier 1600 is equipped with one or more input signal jacks 1610 which are electrically coupled into a preamplifier 1602. The preamplifier 1602 includes, or is coupled to the input jack through, a volume control. The volume control is typically a potentiometer which determines the proportion of the signal present at input jack 1610 that is passed onto other circuitry within the instrument amplifier. The volume control may be adjusted by the user via a control knob 1604 on the outside of the instrument amplifier. Preamplifier 1602 often comprises tone control circuitry which affects the frequency response of the preamplifier and allows the user of the instrument amplifier 1600 to vary the frequency response via control knobs 1604. The amplifier 1602 may also provide for distortion or 'overdrive' circuitry which may also be controlled by the user via other control knobs 1604.

Other 'effects' may be built into the preamplifier or included elsewhere within instrument amplifier 1600 and coupled into the signal path to act upon the signal being amplified. One such effect is a reverberator, shown as reverb 1620. This function may be coupled as a part of preamplifier processing or may be inserted at some point between the preamplifier 1602 and the power amplifier 1630. The extent to which reverb 1620 has an effect on the amplified signal appearing at speaker 1650 may be controlled by the user via one or more control knobs (not shown) on the instrument amplifier. Other effects, such as chorus, delay, or tremolo, may be similarly integrated into instrument amplifier 1600 and may be patched in and controlled by the user through controls on the instrument amplifier, such as switches and potentiometers.

The preamplifier output is a 'line level' output, meaning that the output impedance is typically at least a thousand ohms and the average signal level is usually less than 1 Vrms (one volt root-mean-square), though it can exceed this level at times.

Power amplifier 1630 is equipped to receive the line level electrical signal from the preamplifier at its input 1631 and to amplify the signal so as to drive speaker 1650 to create sound waves having substantial power (or sound pressure level). Power amplifier 1630 typically operates at a fixed gain. The power amplifier typically exhibits a high input impedance and provides negligible load to the input signal. From the input signal the power amplifier generates a corresponding high-power signal its output 1632 at a low impedance, matching that of the coil of speaker 1650. The signal from the preamplifier to the power amplifier may have a voltage on the order of a few volts, but the input signal lacks the ability to directly deliver any substantial current into a low impedance load such as the speaker, hence the need for a power amplifier. In contrast to the power amplifier, the preamplifier is much better suited for voltage amplification, i.e. amplifying microvolt-level signals from instruments up to a line-level amplitude suitable for input to the power amplifier.

Preamplifier 1602 controls the overall gain and output volume level for instrument amplifier 1600 by controlling how much of the signal presented at jack 1610 is provided to power amplifier 1630. Were a signal from an instrument to be fed directly into the power amplifier, there would be no control of the degree of amplification nor any tone control. Some instruments that provide inherently strong electrical signals would be undesirably loud when coupled in this fashion, whereas other types of instruments that provide extremely weak signals would not be sufficiently amplified by power amplifier 1630 alone.

With older amplifiers, particularly tube amplifiers, the signal driving the power amplifier may be provided at such a level that the power amplifier itself is driven to nonlinearity and is relied upon for a certain degree of distortion characteristic. In that case, the overall sound of the amplifier is sensitive to the drive level between a preamplifier stage and the power amplifier.

Most of the modern solid-state instrument amplifiers perform all of the signal processing, such as filtering, overdrive or distortion, and other effects, in a preamplifier stage. The signal out of a preamplifier stage is then coupled to the power amplifier, which operates substantially linearly so as to faithfully amplify the signal from the preamplifier stage to drive the speaker. In these types of amplifiers, the power amplifier is not driven at such a level as to induce distortion and the power amplifier is not relied upon for a distortion characteristic. The power amplifier and speaker may impart some "coloration" or frequency response characteristics, but this effect is experienced even at low signal levels and is not dependent upon signal level.

A very common manner in which the output of preamplifier 1602 is coupled to the input of power amplifier 1630 is now described because this is a highly accessible point at which the present invention may be usefully employed. In many instrument amplifiers, a pair of electrical connectors (jacks 1612, 1614) are provided to allow external connections to the output of the preamplifier into the input of the power amplifier. This can be useful for feeding the output of the preamplifier to other amplification or recording equipment, as well as for inserting further effects or signal processing into the signal path between the preamplifier and the power amplifier. Note that 'jacks' generally refer to 'female' configured electrical connectors whereas 'plugs' refer to 'male' configured electrical connectors, as is well understood in the art. However, this terminology does not preclude the use of any form of electrical connections, of symmetrical connectors or other mating connectors or of the transposition of male and female connectors in some instances.

The various exemplary embodiments of the present invention as shown herein will typically be coupled to such pairs of electrical connectors or 'jacks' on an instrument amplifier. Where a musical instrument amplifier 1600 provides a PREAMP OUT jack 1612 and POWER AMP IN jack 1614, the latter of these two usually acts as a switch in the following manner. Whenever there is no plug inserted in the POWER AMP IN jack 1614, the output of the preamplifier is automatically coupled to the power amplifier input through an internal connection 1616. This relieves the user of having to keep a short external cable plugged in at all times to feed the preamplifier's output signal into the power amplifier. When a plug is inserted in the POWER AMP IN jack 1614, the internal connection to the preamp output is disconnected by switch contacts in the POWER AMP IN jack 1614. In this configuration, the signal path from the preamplifier to the power amplifier must go through an external device, such as an effects pedal connected to jacks 1612 and 1614. When it is desired that the signal pass through an external device in this manner, it is necessary for jack 1614 to decouple the power amplifier from internal connection 1616 which would otherwise shunt the external device. Although a manual switch could be provided for this purpose, it is more convenient for the user to have jack 1614 automatically sense this configuration and switch accordingly based on the mere insertion of a plug into jack 1614.

In a similar fashion, where a musical instrument amplifier provides effects loop connectors comprising a 'SEND' jack and a 'RETURN' jack, the SEND jack and RETURN jack are electrically connected internally so that; when no plugs are connected into the jacks, the SEND and RETURN are simply coupled together. The RETURN jack typically incorporates switch contacts that break the circuit between the SEND and RETURN jacks whenever a plug is inserted in the RETURN jack. Note that these effects SEND and RETURN jacks may be synonymous with jacks 1612, 1614 in some designs or, alternatively, may correspond to a separate tap into the signal path within preamplifier 1602, for example.

The PREAMP OUT jack 1612 or an EFFECTS SEND jack (if so equipped) typically do not perform switching. Consequently, these jacks remain connected to their respective line level signals at all times and can be used as taps by which other equipment can connect to the line level signal out of the preamplifier without interrupting the signal to the power amplifier. For example, a cable may be plugged into jack 1612 to 'tap into' the signal out of preamplifier 1602 to send the signal to an external device accepting line level input. Yet, as long as no plug is inserted into jack 1614, the internal connection 1616 will still couple this signal into power amplifier 1630 and instrument amplifier 1600 will still function normally (unless the external device substantially loads the signal).

FIG. 1 depicts a simple terminating plug 100 equipped with a shunt resistor 101 electrically connected across the tip and sleeve conductors of the plug. Shunt resistor 101 may have a resistance value of 100 ohms or even less. When plug 100 is plugged into the PREAMP OUT or the EFFECTS SEND jack of a typical musical amplifier, shunt resistor 101 presents a substantial load, nearly a short to ground, for the signal out of the preamplifier. This dramatically reduces the signal appearing at the input to the power amplifier. Various values of shunt resistor 101 may be used to achieve a desired degree of attenuation. The degree of attenuation may vary considerably from one piece of amplifier equipment to the next due to the variations in amplifier design and effective impedances of the preamplifier output and the power amplifier input. In general, most designs will even tolerate a short to ground at the line-level output of the preamplifier without damage or overstress to components in the instrument amplifier. As shown in FIG. 1, plug 100 may bear an indication of its relative attenuation value, such as a label 102, in this example displaying a value of '10'. An assortment of plugs having different attenuation or shunt resistor values may be provided and similarly labeled so that a user can select a desired value.

FIG. 2 depicts an attenuator cable in accordance with an alternative embodiment wherein a mono-to-stereo Y-adapter cable is used in conjunction with a stereo plug to couple a voltage divider circuit into the signal path of an instrument amplifier. Adapter cable 201 is well-known and readily available from many manufacturers of audio cables. Plugs 203 and 204 are monaural 2-conductor plugs each having a tip and a sleeve. In-line stereo jack 205 is a female connector having tip, ring, and sleeve contacts. The sleeves of connectors 203, 204 and 205 are connected together in adapter cable 201 and correspond to the outer shield of the shielded electrical cable by which they are interconnected. The tip of connector 203 is connected to the tip contact inside jack 205 whereas the tip of connector 204 is connected to the ring contact inside jack 205. Normally this type of adapter cable 201 is used to adapt between a 3-conductor stereo cable (with left and right channels carried on two separate conductors surrounded by a shield) and two separate 2-conductor cables each carrying either the left or the right channel. As used in accordance with the present teachings, this type of adapter cable is used to combine the 'send' and 'return' connections of an amplifier effects loop or preamplifier tap and to provide these connections through a single jack. An electrical schematic 210 of adapter cable 201 is provided for reference and to clarify the manner in which voltage divider circuit 212 is coupled to plugs 203 and 204.

In accordance with a first usage configuration, the combined adapter cable 201 and plug 202 may be coupled to a musical instrument amplifier by inserting plug 203 into either the PREAMP OUT or EFFECTS SEND jack of the amplifier. Plug 204 is inserted into the 'PWR AMP IN' or 'EFFECTS RETURN' jack on the amplifier. This causes audio signals from the preamplifier of the instrument amplifier to have to go through jack 205 to be coupled to its power amplifier. In accordance with a second usage configuration, plugs 203 and 204 may be 'reversed', meaning that plug 204 connects to the PREAMP OUT or EFFECTS SEND jack and that plug 203 connects to the PWR AMP IN or EFFECTS RETURN jack. If voltage divider network 212 is designed properly, the act of reversing these connections to accomplish either the first configuration or the second configuration can be used to alter the amount of attenuation applied to the audio signal without having to change plug 202 or any of the resistor values therein. Attenuation can be expressed as a ratio of input signal level to output signal level, such as '50:1', or as a corresponding proportion factor (such as 0.02) by which the input signal will be multiplied to yield the output signal. Attenuation can also be expressed logarithmically in decibels (dB), but for simplicity this convention is not used herein.

Plug 202 typically comprises a housing 206 that may be removed to gain access to the electrical terminals of the connector and connect wires thereto. In the more typical use where plug 202 is mounted to the end of a wire cable, housing 206 is sometimes used to provide mechanical support or strain relief for the wire cable as well as to provide a protective covering for the electrical connections. In accordance with the present teachings, however, it is envisioned that housing 206 may simply serve to contain resistor network 212 and provide a handle for grasping plug 202 to inserted or remove it from jack 205. A metal or conductive housing, if used, will also serve as an electrical shield around the circuit to prevent 'hum' and other stray signals from being coupled into the amplifier input.

In accordance with an exemplary embodiment, voltage divider network 212 comprises at least two electrically resistive portions, schematically shown as R1 (221) and R2 (222). These may be implemented, for example, as discrete resistors, as elements in a thin-film or thick film resistor array, or as portions of a potentiometer with the wiper of the potentiometer corresponding to the point at which the two resistive elements are connected to one another. In accordance with a preferred embodiment, resistors 221 and 222 are quarter-watt metal oxide film or carbon film resistors. Surface mount components may also be used. Aside from passive resistive elements, it is understood that semiconductor devices, photoelectric devices or duty-cycle-switched CMOS analog switches may be employed in place of passive resistive elements anywhere they are depicted herein.

In accordance with an exemplary embodiment, resistor 221 has a value of around 10 K ohms and resistor 222 has a value of around 100 ohms. When connected in accordance with the first configuration described above, the input audio signal from the preamplifier, which is a voltage with respect to the shield conductor of all of the connectors, appears at the tip of plug 202 and causes current to flow through resistor 221 and resistor 222 in series. The other end of resistor 222 is connected to signal ground by being connected to the common shield conductor of all the connectors. In the series circuit formed by resistor 221 and resistor 222, a voltage signal appears at junction 230 that is in direct proportion to the audio input signal at the tip of plug 202 but is diminished in amplitude by a given ratio. This ratio may be approximately determined by dividing the value of resistor 222 by the sum of the values of resistors 221 and 222. In accordance with an exemplary embodiment of the present invention, the values of the resistors are chosen to result in the voltage at junction 230 being roughly 1% of the input voltage. The voltage signal at junction 230 may be provided back to the instrument amplifier (to eventually reach its power amplifier stage) by coupling junction 230 to the ring conductor of plug 202. In turn, this signal appears at the tip of plug 204 which, according to the first configuration feeds the reduced signal to the power amplifier input.

Although a direct connection between junction 230 and the ring conductor of plug 202 would certainly accomplish the desired coupling, it is considered advantageous to include resistor 223 in the circuit as shown. Resistor 223 may have a value of, for example, 1000 ohms. Given the typically high impedance of the input to a power amplifier, this series resistor will have little effect on the attenuation of the signal experienced through the resistor network 212. However, resistor 223 becomes important when plugs 203 and 204 are reversed in accordance with the second configuration mentioned above. When connected in the second configuration (with signal passing into plug 204 and being returned to the amplifier through plug 203) resistor 223 and resistor 221 swap roles in the circuit. The divide ratio of resistor network 212 is then determined by the ratio of resistor 223 to the sum of resistors 222 and 223. Using the exemplary resistance values mentioned above, the second configuration would result in a voltage being returned to the instrument amplifier that is roughly 10% of the signal that was received from the instrument amplifier.

Thus, without changing any values in resistor network 212, it is possible for the user of the device of FIG. 2 to select from among two different attenuation ratios merely by swapping the orientation in which plugs 203 and 204 are plugged into the amplifier.

In some implementations, it may be possible to eliminate resistor 223 such that, when connected in the second configuration, resistor 222 merely serves as a shunt across the line level signal and acts much like the apparatus that was depicted in FIG. 1. Of course, this makes the attenuation experienced in the second configuration highly dependent upon characteristics of the amplifier to which the attenuator cable is being applied. Thus, it is considered preferable to include resistor 223 having an established value, which provides the user better control of attenuation characteristics for a wide variety of makes and models of instrument amplifiers.

The electrical impedance, attenuation and symmetry characteristics of the voltage divider may be readily changed by plugging in different plugs 202 containing different resistor values.

In some cases, it may be desirable to provide extreme simplicity for the end user or to facilitate installation in dark or cramped spaces where markings on the attenuator cable would be difficult to observe. In other words, it may be desirable in some circumstances to form an attenuator cable that provides the same amount of attenuation regardless of signal direction. This is easily accomplished by setting the value of resistor R1 equal to the value of resistor R3, forming a symmetrical voltage divider or attenuator. Of course, this sacrifices the ability to vary the amount of attenuation by changing the direction of signal flow through the cable. Alternatively, some features can be incorporated in the attenuator, such as shaping, bumps or surface features, which can be tactilely sensed in the dark to indicate 'polarity'.

Note that, to distinguish plug 203 from 204 and to facilitate selectively applying the apparatus in accordance with the first configuration or the second configuration, either or both of plugs 203 and 204 will preferably have some distinguishing mark or attribute, such as a difference in appearance, tactile feel, texture, color, shape, markings or indicia, etc. In FIG. 2, for example, plug 203 may have a band or a label of some nature to distinguish it from plug 204. Without such a feature, a user may have to use trial-and-error to get a desired result rather than being able to intentionally connect the cable in the first configuration or the second configuration as desired.

Those of skill in the art will recognize that various means may be used to designate or distinguish various connectors of attenuator devices shown herein. Particularly where an attenuator cable or device comprises two otherwise identical connectors and where the direction of the signal through the cable affects the attenuation that a signal will experience, it is important to clearly identify one end of the cable from another. In this way, the user may readily and consistently achieve a desired attenuation value when installing the attenuator cable or device.

Types of markings to identify one end of the attenuator device from another may include a sleeve or heat shrink tubing applied to the cable, the connector, or both. The sleeve or heat shrink tubing may have the characteristic color or may be labeled or marked in such a way that distinguishes the associated connector or end the cable from the other end(s) of the cable. Alternatively, the connector may be embossed, sandblasted, engraved, stamped or molded with some distinguishing marking or may be painted, dyed or otherwise altered in appearance in some manner to distinguish it from other similar connectors of the apparatus. In the case of metal connectors, certain chemical treatments such as etching, brush plating, chemical staining, etc. may be employed to distinctively mark the connector.

FIG. 3 depicts an alternative embodiment in a form resembling a simple short cable with plugs at either end. Attenuator cable 300 preferably comprises a pliable shielded coaxial cable 312 such as a microphone cable or musical instrument cable. A resistance network 312 may be built into the cable or, where molded connectors are used, incorporated at the connectors and encapsulated into the body or grippable portions of the connectors during the molding process. In accordance with an exemplary embodiment, right angle phone plugs 310 may be employed that are similar to SWITCHCRAFT™ Model 238 connectors which comprise a two-part metal housing. Such connectors comprise a hollow portion that may be opened up to permit connections to be made and which encloses a large enough space to allow for some circuitry to be built inside the connector housing. As with resistor network 212, resistor network 312 should include at least resistors 321 and 322. Resistor 323 is optional but is considered to be preferable for the reasons stated above. As will be described below, the devices of FIG. 4 operate similarly to that of FIG. 3 in that the plugs may be reversed to change the amount of attenuation imposed on the signal.

Those of ordinary skill in the art will recognize that while the exemplary embodiments depicted herein mainly show two alternative inputs, it is possible to implement a unit that provides more than two connections and provides a voltage divider circuit which enables a variety of different attenuation values to be selectively activated by the user by connecting certain ones of the attenuator connections to the Amplifier.

Right angle connectors are shown FIG. 3 as one possible embodiment. A typical straight electrical connector or plug may protrude directly out from a panel when plugged into a jack in the panel. These protruding plugs are susceptible to mechanical damage as the amplifier is moved about or as equipment, guitars or other objects pass near the control panel or bump into the amplifier. In particular, an attenuator cable embodying the present invention is more likely than other connections to remain plugged into the amplifier at all times, even when the amplifier is being transported. Consequently, it is considered preferable to select a type of connector that reduces the likelihood of damage even if it remains plugged into the amplifier equipment at all times. In many configurations of panels on amplifier equipment, the use of low-profile right angle phone plugs, similar to a SWITCHCRAFT™ Model 238, enables the attenuator cable to safely remain plugged into the amplifier at all times with minimal risk of mechanical damage to the connectors into the amplifier jacks. In some configurations of panels on amplifier equipment, angled connectors other than right angle connectors may also be suitable. Any of the embodiments shown herein may benefit from the use of angled or low-profile plugs. An angled plug is generally one wherein the long axis of the cable entering the plug is not concentric with or not parallel with a principal axis of the plug contact elements.

Figure 4:
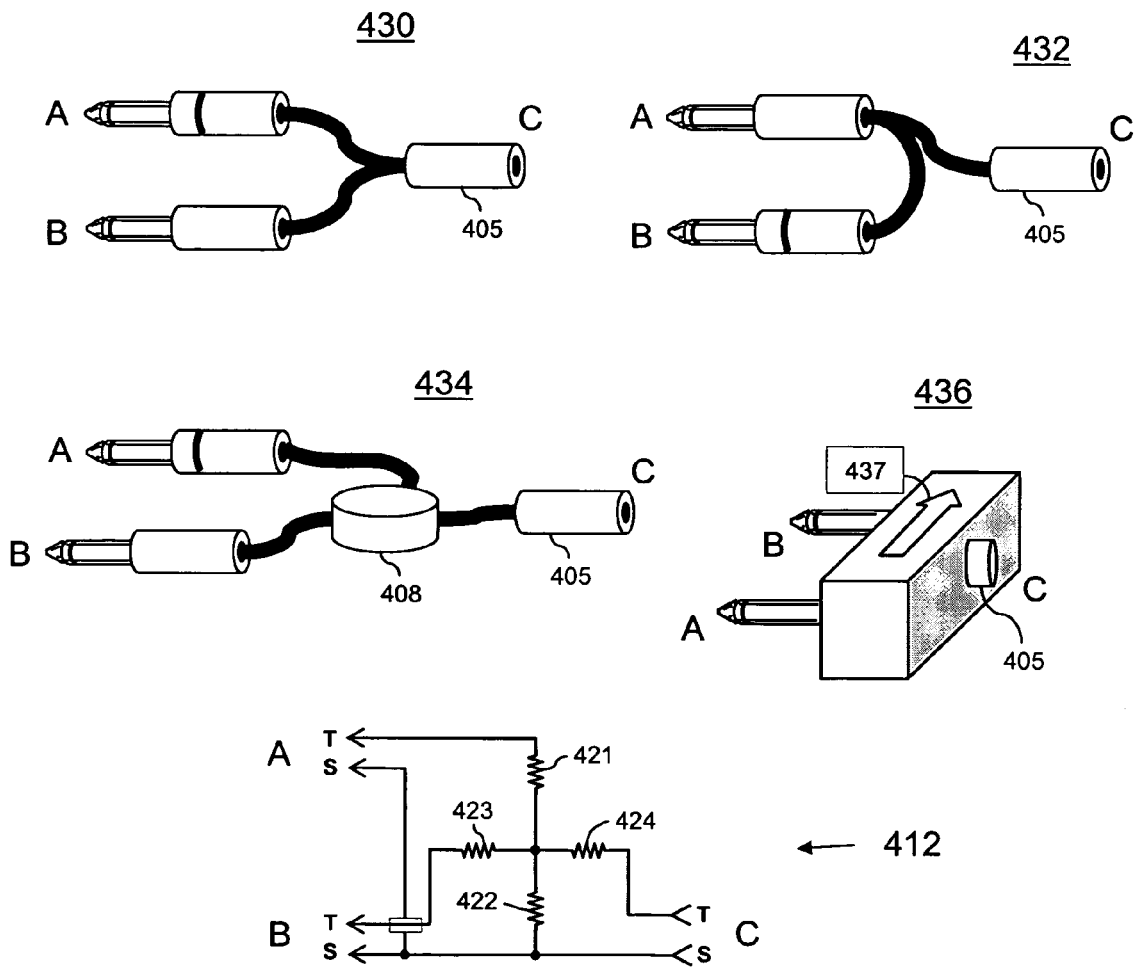
FIG. 4 illustrates a multi-connector device employing a jack and configured to attenuate electrical signals in an instrument amplifier in accordance with an example embodiment of the present invention.

FIG. 4 represents yet another embodiment which adds the capability to be combined with other equipment that a user may connect to the instrument amplifier through its preamplifier tap or effects loop connectors. Some users of electronic instrument amplifiers use the effects loop or preamplifier tap for its intended purpose, namely taking a signal from the preamplifier, performing other processing of the signal, and then returning the modified signal to the amplifier to eventually reach the power amplifier. To accommodate such use while still benefiting from the present teachings, an embodiment is envisioned wherein the attenuating characteristics may still be advantageously used in conjunction with other external equipment. It should be noted, however, that the arrangement of FIG. 4 is not strictly for use with other external devices connected into the preamplifier tap or effects loop. The arrangement of FIG. 4 may be applied in the same fashion as the devices of FIG. 1, 2 or 3 merely by connecting its plugs into the appropriate connectors on the instrument amplifier. No other connections need be made and, by proper design of resistor network 412, the unit can be made to exhibit the same direction-dependent controllable attenuation as with the other designs.

Note that resistors 421, 422 and 423 form a network 412 similar to network 212 described earlier.

In FIG. 4, several different "form factors" are shown which may be suitable for implementing a device comprising circuit 412. Cable 430 comprises two plugs and a jack and physically resembles a standard 'Y' connector 201 mentioned earlier. The resistor network of circuit 412 may be constructed within cable 430, molded into any of the connectors or distributed among the connector housings. Cable 432 is a slight variation wherein two cables converge into one of the plugs.

Cable 434 is a version comprising a separate pod or molded portion from which the cables and connectors extend outwardly. In such an arrangement, it may be convenient to contain circuit 412 within the central pod 408. This type of construction may facilitate manufacture by allowing standard, commonly available molded connectors to be used at the periphery and then only forming the central portion around the cables to contain the circuitry 412 in accordance with an exemplary embodiment.

Finally, another form of cable or connector 436 is shown comprising a rigid housing or molded portion from which two plugs emerge at a roughly fixed distance from one another, which may be adequate to commonly certain makes and models of instrument amplifiers. Some designs may allow for limited motion of the plugs or flexure of the connector body to accommodate slight differences in spacing from one amplifier unit to another.

The molded body of this connector may be provided with a contour or with surface features that facilitate firmly gripping the device during insertion and removal. Additionally, this connector may be provided with markings 437 or other features to indicate the directionality of the connector so the user may readily determine which direction will accomplish the desired attenuation value. For example, a first arrow-shaped marking or relief running along the device may be labeled to indicate a signal direction that will result in a strongly attenuated signal. An optional second arrow in the opposite direction may indicate a moderate degree of attenuation. To provide an intuitive indication, the second arrow may vary in appearance, such as being thicker, bolder or stronger, than the first arrow to reinforce the concept that the second signal direction will result in a stronger signal. This connector may contain a resistor network similar to circuit 412 which is housed inside or molded inside the connector body. Connector 436 may include a jack 405 and may implement a circuit similar to resistor network 412. Alternatively, connector 436 may exclude jack 405 and may contain a circuit such as resistor network 312.

In each of the variations shown in FIG. 4, in-line jack 405 is a 2-conductor jack having the tip connected into the divider network 412 as shown preferably through a resistor 424. To further explain the potential role for resistor 424, it is useful to briefly referred to FIG. 6 of the accompanying drawings.

In FIG. 6, there are several configurations by which the devices of FIG. 4 may be connected to the amplifier and to external equipment.

The first two configurations shown in FIG. 6 accomplish attenuation of the signal before it passes into the devices in the effects loop. The third configuration achieves attenuation after the external effects devices, which may be useful if drive-level-sensitive effects, such as distortion, sustain or 'auto-wah' effects device are used in the loop.

As shown in the fourth configuration in FIG. 6, an attenuator device in accordance with the present invention may also be inserted between two effects pedals and, as with the embodiments described above, may be reversed end-for-end to alter the signal attenuation ratio.

Note that the value of resistor 424 primarily determines the amount of attenuation applied to the signal in the "post-attenuation" configuration shown as the third configuration in FIG. 6. In the other configurations, this resistor has negligible effect, assuming the impedance of the device connected at jack 405 has a relatively high effective impedance. For example, choosing a resistance value for resistor 424 that is between that of resistors 421 and 423, the device may be used to offer a third unique level of attenuation. With values of 5 K ohms for resistor 423 and 100 ohms for resistor 422, the third level of attenuation will be approximately 50:1. Thus, FIG. 6 depicts a way to provide three different attenuation values, while accommodating additional equipment in the effects loop, without having to change any component values in the attenuator device.

Figure 5:
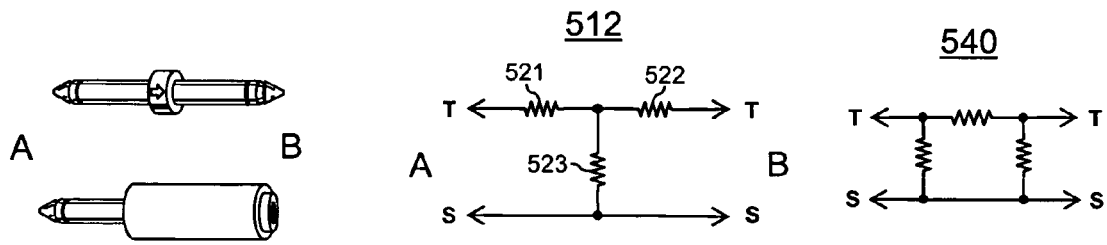
FIG. 5 illustrates a compact device configured to attenuate electrical signals in an instrument amplifier in accordance with an example embodiment of the present invention.

Returning now to an earlier point in the drawings, FIG. 5 depicts a very compact arrangement of back-to-back male connectors, sometimes referred to a 'bullet' connector, which may be suitable for insertion between adjacent effects foot pedals or "stomp" pedals which are popular. Those of ordinary skill can readily envision how circuit 512 can be built into or molded into such a connector arrangement. Note that resistors 521, 522 and 523 are comparable to resistors 321, 322 and 323 described earlier. An alternative resistor network 540 known as a 'pi-network' is also shown and may be used in any of the circuits similar to network 512. However, a 'T-shaped' resistor network similar to network 512 is believed to be preferable because it is simpler to independently control the attenuation ratios for either direction of signal flow and because a greater disparity of direction-dependent attenuation ratios can be established. In a novel manner, the present invention can take advantage of the favorable conditions of the preamplifier output impedance and power amplifier input impedance, in conjunction with a properly designed attenuation network, to provide multiple attenuation levels using fixed components.

Figure 7:
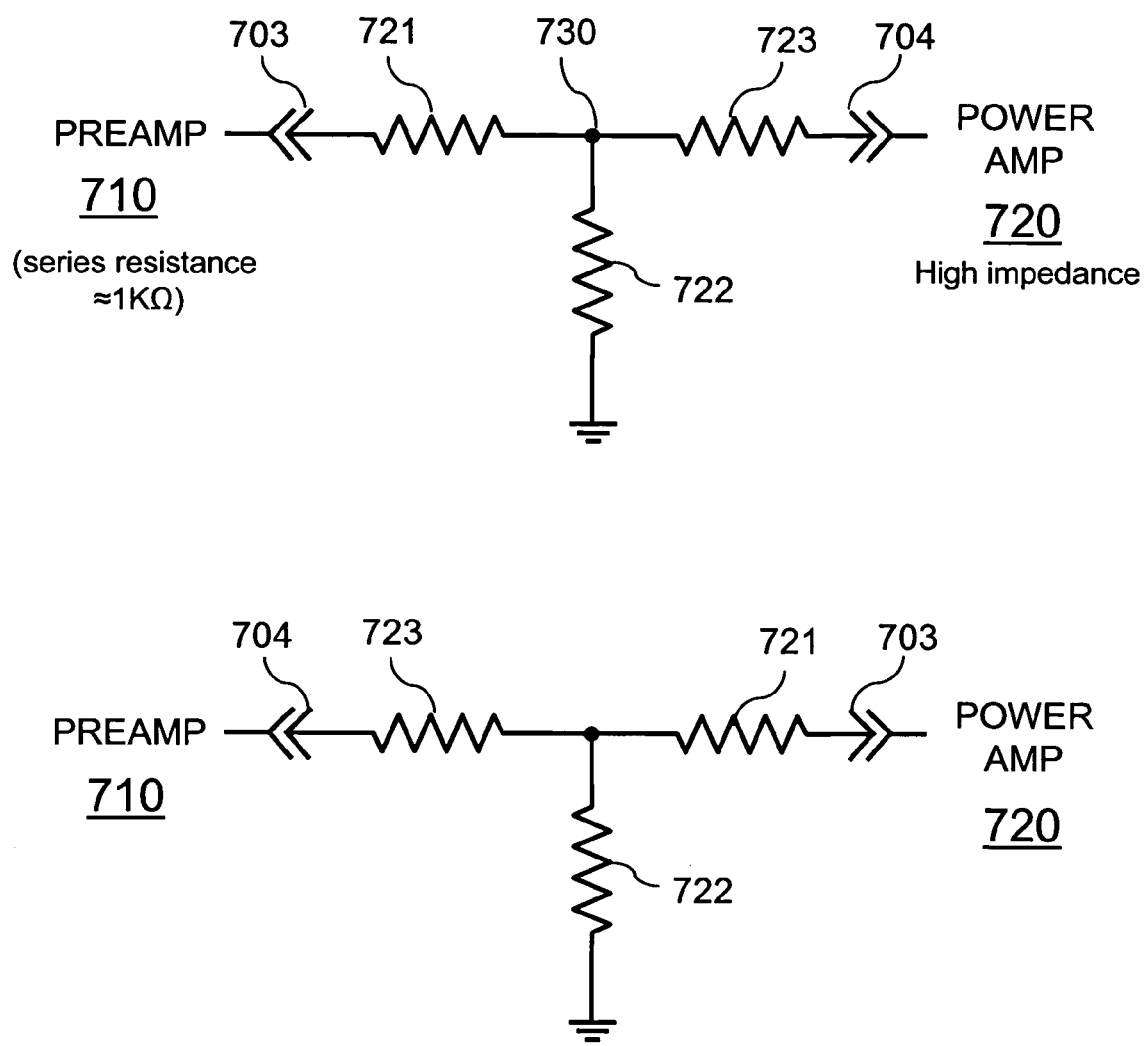
FIG. 7 provides electrical schematic diagrams to illustrate the operation of some example embodiments of the present invention.

To illustrate the principal of operation of the present invention in accordance with an exemplary embodiment, FIG. 7 depicts how a fixed resistor network in accordance with the present teachings may be advantageously employed in conjunction with the particular impedance characteristics of the preamp loop or effects loop of typical instrument amplifiers. FIG. 7 is especially useful to show how a resistor network may provide direction-dependent attenuation to allow for user selection of attenuation value without the need for variable or adjustable components, moving parts or active components. While the use of fixed, passive resistor designs is thought to be preferable or advantageous in many applications, the present invention should not be construed to strictly exclude such variable, adjustable, movable or active components. As will be shown later herein, various embodiments may be realized which use these components and yet are configured to operate according to the principle of the present invention and to offer the benefits thereof.

In FIG. 7, a first configuration is shown which operates on a principal similar to that described earlier for circuit 312. Resistor network 712 is depicted to be connected between a preamplifier 710 and a power amplifier 720 of an instrument amplifier. Connectors 703 and 704 correspond to the plugs by which the device 712 is typically connected to an instrument amplifier. The effective impedance of the preamplifier output is typically around 1000 ohms, although this value often ranges from a few hundred ohms up to a few thousand ohms. A voltage signal provided by the preamplifier causes current to flow through resistor 721 and resistor 722 as a pathway to the signal ground. By selecting an adequately high value for resistor 721 (around 10 K ohms) and a low value for resistor 722 (around 100 ohms), a voltage dividing ratio is established that is relatively independent of the output impedance or equivalent series resistance of the output of the preamplifier. As described earlier, a voltage signal provided by the preamplifier is effectively diminished by a ratio of 100:1 (in other words, multiplied by a proportion factor of 0.01) as it appears at junction point 730. This reduced signal is provided to the input of the power amplifier through resistor 723. Because the input impedance of the power amplifier is typically quite high, the value of resistor 723 has very little effect upon the voltage attenuation ratio of the device. In other words, the divide ratio is dominated by the relationship between the values of resistor 721 and resistor 722.

The lower half of FIG. 7 depicts a second configuration that is accomplished by reversing the connections of the plugs of the attenuation device with respect to the jacks of the amplifier. Note that in the second configuration this reversal of the plugs is equivalent to swapping the positions of resistor 721 and 723 in the circuit shown. In this configuration, it is the relative values of resistors 723 and 722 that principally determine the voltage division ratio that the signal experiences through the device. In contrast to the first configuration, the value of resistor 721 has almost no effect on the voltage division ratio (the attenuation ratio) when the device is connected into the amplifier in this manner.

In some instrument amplifier designs, the signal quality, such as linearity or frequency response, may be altered or degraded if the output of the preamplifier is subjected to a significantly different load compared to the high impedance power amplifier input to which it is normally connected. Therefore, it may be desirable to ensure that an attenuator device does not present too low of an impedance to the output of the preamplifier, regardless of whether the attenuator device is connected in a first configuration or a second configuration as described above. At the same time, it is desirable that the attenuation ratios in both the first and second configurations are usefully high, such as in the range of from 5:1 to 100:1. An attenuator circuit operating according to the principal described in FIG. 7 exhibits the desirable characteristic that, once one decides upon a minimum acceptable impedance that the attenuator may present to the preamplifier output in any configuration, the attenuation ratio achievable in both of the configurations can be greater than the ratio of the selected minimum impedance plus the preamplifier output impedance, all divided by the selected minimum impedance. Phrased differently, this means that the impedance of the electrical attenuator circuit as experienced by the preamplifier output is maintained greater than a given minimum impedance value in both the first and second usage configurations and that both the proportion factors corresponding to the first and second usage configurations are less than the ratio of the given minimum impedance divided by the sum of the given minimum impedance plus a characteristic impedance of the preamplifier output. These conditions are not met by using a simple voltage divider circuit, but rather are achievable by using an additional resistor, such as resistor 723 in network 712, in accordance with the present teachings.

Any of the resistors shown in the exemplary attenuation networks of FIG. 7 (and elsewhere herein) may be replaced by potentiometers or by resistance values that are switched into or out of the circuit using small switches, to act as variable resistance elements. Active devices such as transistors or integrated circuits may be used as well. However, the preferred implementation using only passive fixed resistors is considered to be advantageous for its low cost, compactness, simplicity and reliability. In particular, a preferred embodiment of the present invention cleverly allows for varying the degree of attenuation without requiring any moving parts, active components or variable components.

Embodiments of the present invention which operate on the principle depicted in FIG. 7 are designed in recognition that, due to the particular environment of an instrument amplifier, i.e. the impedances that are typically present and the reversibility of the connections, it is possible to make an attenuator cable having additional utility. In contrast to a simple two-resistor voltage divider, a third resistor can be added to provide an independently configurable alternative attenuation value in a single cable or device. Another consideration in such designs is that the resistance values can be high enough such that the attenuation ratio is consistent and relatively independent of preamplifier output impedance, which may vary somewhat from one model of amplifier to the next.

FIG. 8 shows an embodiment wherein two directional attenuators 812 and 813, each comprise a fixed resistor network, yet may be connected in a variety of ways to yield at least ten different attenuation ratios. The pair as shown (or set of three or more attenuators) may be manufactured and marketed as a set and may be used separately or together. The network in attenuator 812 is preferably uses different resistor values than the network in attenuator 813 to provide more variety in the ratios that may be achieved. These attenuation ratios, and the specific connection arrangements to achieve each one, are depicted in the lower part of FIG. 8. The attenuation ratios shown may also be translated into multiplicative proportion factors. For example, where a ratio of 4:1 is shown, this corresponds to a proportion factor of 0.25. A common cable with male plugs at either end, such as an instrument cable, can be connected in conjunction with either or both of attenuators 812, 813 between the female jacks of the instrument amplifier labeled as "FROM PREAMP" and "TO PWR AMP". Note that when an attenuator which has been designed in accordance with the present teachings is inserted at one of the cable, it will exhibit one attenuation value and, when placed at the opposite end of the cable, it will provide a different attenuation value. Furthermore, cascading the attenuators makes use of the interaction among the two resistor networks to create other composite attenuation ratios. It is possible to consider all combinations of connection directions and to choose resistor values that make best use of the advantages of this approach. In accordance with a preferred embodiment, the resistance values are chosen to provide the most desirable range of attenuation values, to provide even coverage of the range of values and to present a high enough impedance to the preamp that assure that the attenuation ratio is substantially independent of the preamp output impedance. The example resistor values shown for both attenuators are standard resistor values.

Other resistor values may be used to achieve the desired range and number of different attenuation ratios that are achievable. A female back-to-back connector (or an effects pedal that has female in-female out connections) could also be used in various ways to achieve two more attenuation ratios beyond those shown. It is also worth noting that the attenuators may each be used in separate applications when not being used together to obtain a particular attenuation value. This aspect provides a good value to the end user who purchases a set of the attenuators. Furthermore, as an alternative to designing the networks to be different, the networks can be made identically, resulting in only five distinct attenuation ratios but providing for similar attenuation ratios to be used in separate places at the same time. This may also simplify manufacture and stocking of manufactured items.

In some cases, it may be preferable to utilize fixed resistor networks as shown thus far to perform an attenuation function. In comparison to implementations of which may use moving or adjustable parts, the fixed resistor networks are less subject to wear, damage and failure, collecting dirt, and generally make the attenuator device less expensive to manufacture. Nevertheless, embodiments of the present invention may be realized which advantageously make use of circuit components, such as potentiometers and switches, so that some portions of the attenuator circuit act as variable resistance elements to provide variability in the attenuation characteristics of the apparatus.

To summarize, in the arrangement depicted in FIG. 8, attenuation of electrical signals may be accomplished in some instances by passing the electrical signals through both the first attenuator device 812 and the second attenuator device 813 and the first attenuator device 812 is configured to be reversibly connected into the signal path, such as by being connected at either end of a cable. Due to the asymmetry of the first attenuator, the amount of attenuation exhibited by the composite apparatus is varied by the user selecting whether the electrical signals pass from a first electrical connector of the first attenuator to the second electrical connector of the same, or vice versa. The second attenuator is similarly reversible to affect attenuation. Furthermore, selecting the order in which a signal traverses the attenuators, that is, first-then-second or vice versa, may be used alternatively to, or additionally with, the reversibility just described to further control the attenuation of the composite apparatus. The number of possible attenuation values achieved by various permutations is enhanced by the asymmetric design of the attenuator circuits and the ability to connect the attenuator devices in a wide range of configurations.

Figure 9:
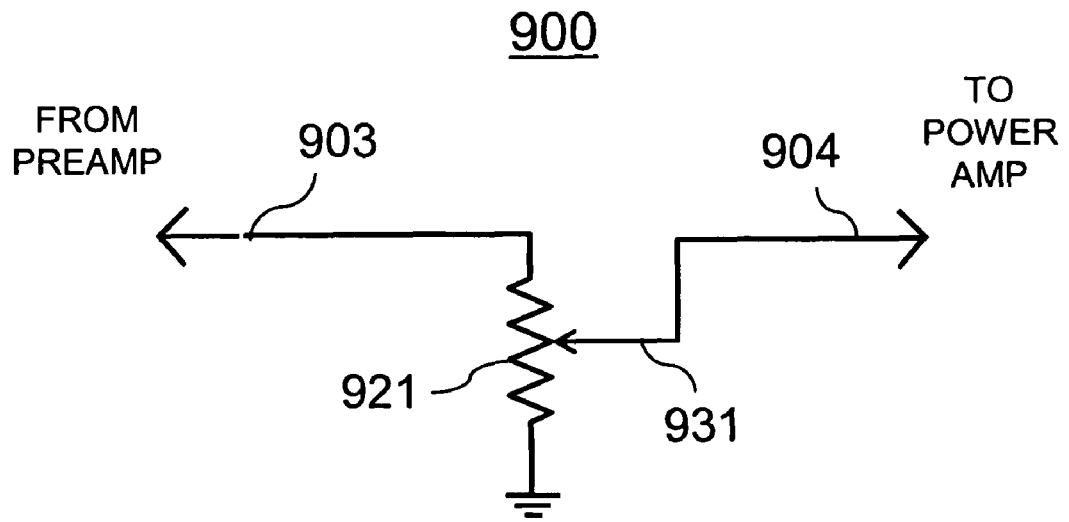
FIG. 9 is an electrical schematic of an adjustable voltage divider.

Referring now to FIG. 9, a simple attenuator 900 is a shown being formed from a single potentiometer 921. The position of the wiper 931 of potentiometer 921 determines what proportion of the signal coming from the preamplifier through jack 903 will be coupled to the power amplifier via jack 904. While this arrangement provides variable attenuation of the signal passing the direction from jack 903 to jack 904, this arrangement may not be as well suited for use in an instrument amplifier as some of the other arrangements described herein. For example, trying to set the attenuator 900 to a relatively high attenuation ratio involves setting the control using only a small portion of its range—essentially returning to the original problem encountered with the volume control of the instrument amplifiers itself. Secondly, connecting this attenuator in reverse causes the lower half of the potentiometer to act as a shunt and makes the attenuation in that direction difficult to adjust or predict. In the reverse configuration, the preamplifier output will go directly into the lower half of the potentiometer and it is possible that excess power dissipation may overstress the potentiometer material and cause failure.

Figure 10:
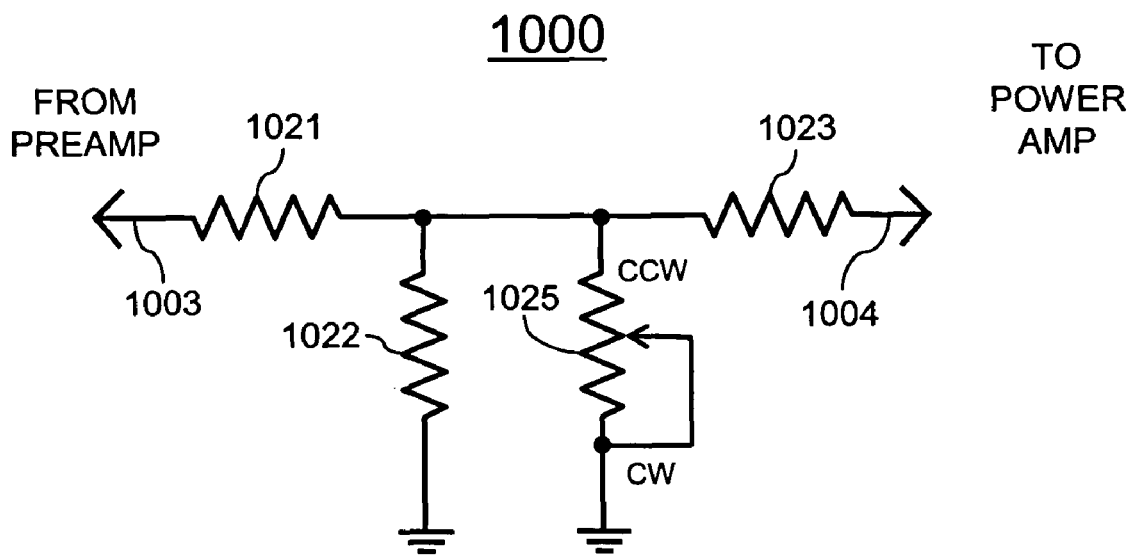
FIG. 10 is an electrical schematic of a variable attenuator device using a potentiometer in accordance with an exemplary embodiment of the present invention.

FIG. 10 depicts an alternative embodiment in accordance with the present invention. Attenuator 1000 comprises three fixed resistors 1021, 1022, and 1023 which operate in a similar fashion to the circuit shown and described earlier in FIG. 7. A potentiometer 1025 is added in parallel with resistor 1022.

An input signal provided via jack 1003 goes through a voltage divider formed in part by resistors 1021 and 1022. However, a variable resistor or potentiometer 1025 acts in parallel with resistor 1022 to form the lower half of the voltage divider. The collective resistance of resistor 1022 and potentiometer 1025 may vary from zero up to a particular maximum value determined by the value of resistor 1022 in parallel with the maximum (generally full clockwise) value of potentiometer 1025. Optionally, resistor 1022 may be eliminated so that the lower half of the voltage divider is determined solely by the maximum resistance value of the potentiometer or variable resistor. Employing resistor 1022 may afford some protection against loud sounds or damaging transients if the wiper of the potentiometer becomes 'noisy'.

As with many of the fixed attenuator configurations described earlier, attenuator 1000 may be connected in reverse to an instrument amplifier, that is, with signal entering jack 1004 and being returned to the amplifier via jack 1003. In this configuration, resistor 1023 becomes the upper half of the voltage divider. The lower half of the voltage divider remains formed by resistor 1022 and potentiometer 1025. In the reverse direction, as described earlier, resistor 1021 will have negligible effect on the attenuation ratio. The arrangements of resistor elements in attenuator 1000 offers an advantage in that the sense of the potentiometer (e.g. clockwise increases signal level) remains the same in either direction of signal flow. For example, attenuator 1000 may provide signal adjustment in a forward direction in a range of zero to 20% and, in a reverse direction, in a range of from zero to 5%. With the potentiometer set to half of its range, the forward direction may result in a 10% output signal level and the reverse direction may provide an output signal at 2.5% of the input signal. Turning the potentiometer 'upward' increases the signal level in either direction, even though the signal levels are on different scales.

Figure 11:
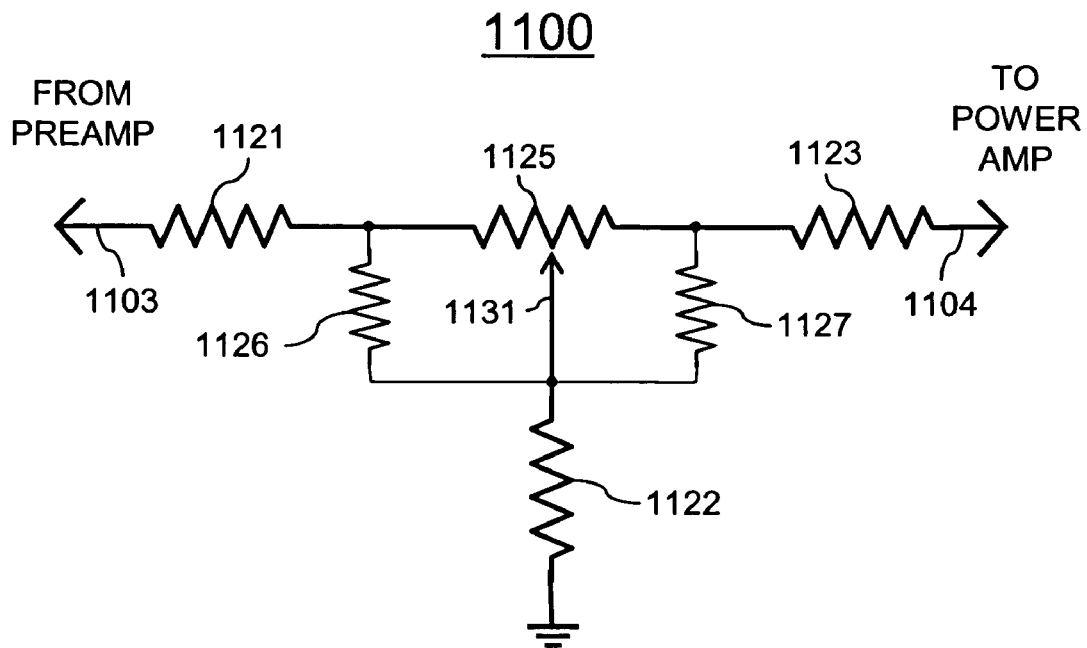
FIG. 11 is electrical schematic of a variable attenuator device using a potentiometer in accordance with an exemplary embodiment of the present invention.

FIG. 11 depicts yet another embodiment advantageously employing a mixture of fixed and variable resistor elements. Attenuator 1100 comprises a potentiometer 1125 position at the junction between resistors 1100, 1122 and 1123. Potentiometer 1125 may be used to shift the relative resistance values between the left half of the circuit and the right half of the circuit. The wiper 1131 of potentiometer 1125 may be envisioned as a movable junction point, comparable to junction point 730 in circuit 712. Adjusting the potentiometer by moving the wiper to different point along an electrically resistive surface causes resistance to be added to one side of the circuit and to be taken a way from the other side of the circuit. This effects how much difference there is in attenuation ratios of the device is connected in a first configuration (signal from jack 1103 to jack 1104) versus a second configuration (signal flowing from jack 1104 to jack 1103).

If the circuit is designed symmetrically, then potentiometer 1125 may be set to position wherein the two sides are exactly balanced and the attenuator operates symmetrically, that is, offering the same attenuation regardless of signal direction. Nevertheless, the presence of the potentiometer gives the user the ability to purposefully set a desired level of asymmetry. Resistors 1126, 1127 may be optionally included as protection against noise or high resistance conditions between the wiper 1131 and the resistive element of the potentiometer 1125.

Figure 12:
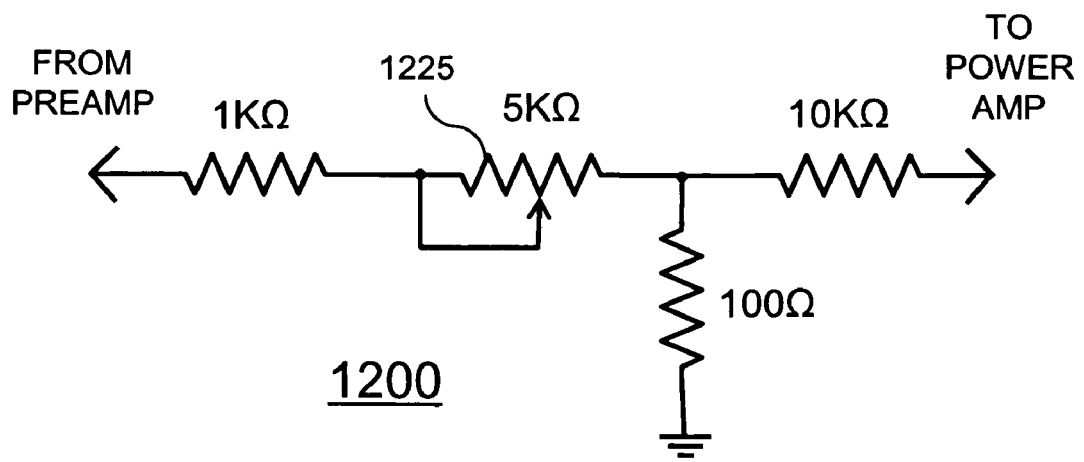
FIG. 12 is electrical schematic of a variable attenuator device using a potentiometer in accordance with an exemplary embodiment of the present invention.

FIG. 12 depicts yet another alternative attenuator network 1200 wherein, using the resistance values shown, potentiometer 1225 allows for an adjustable attenuation ratio of from 10:1 up to 60:1 when the attenuator is employed in a first configuration. When the connections to an instrument amplifier are reversed in a second configuration, attenuator 1200 exhibits a fixed 100:1 ratio. Those of ordinary skill will recognize how to select component values to yield desired ratios and ranges of adjustment. Note that, in this design, noisy contacts in potentiometer 1225 are not as apt to cause serious problems. Even if the wiper contact went momentarily 'open', the signal would be even more attenuated through the device rather than being suddenly unattenuated and dramatically escalating in amplitude.

If a potentiometer is used as a variable resistance element, such as in one of the various circuits of FIGS. 9-12 or in other arrangements, then it is desirable to incorporate the potentiometer into the attenuator device in a compact, manufacturable and aesthetically appealing fashion. It is also desirable that the user be able to adjust the control, yet a designer must consider that the user may not want to set the control very frequently. A user may not want a design wherein the control knob for the potentiometer is so exposed that it is prone to being inadvertently bumped out of adjustment or is unattractive or unwieldy.

Figure 13:
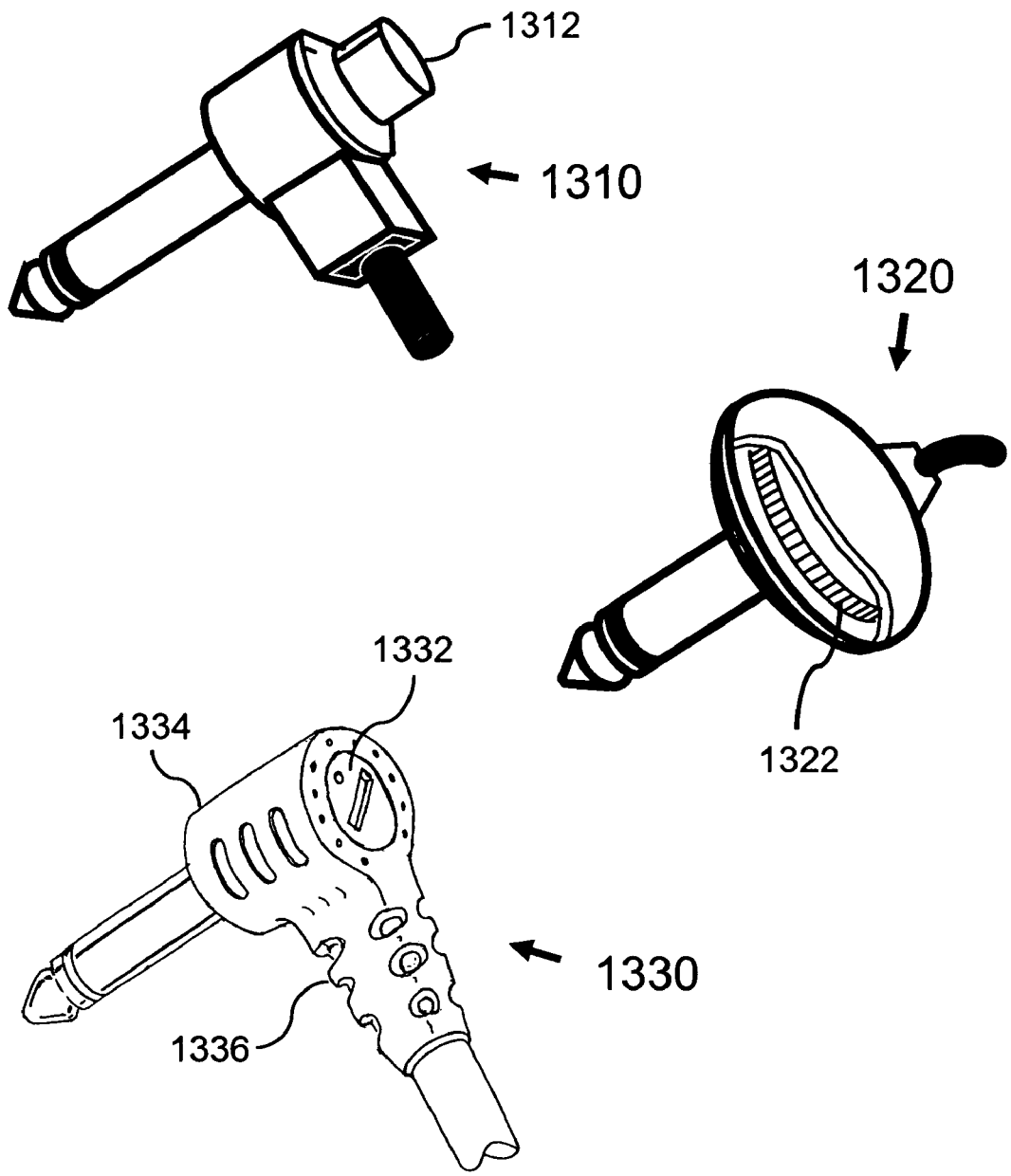
FIG. 13 illustrates several designs for connectors with integral potentiometer or switch controls in accordance with exemplary embodiments of the present invention.

In FIG. 13, some possible designs for a manufactured item are depicted wherein the control of the potentiometer is integrated into the 'body' of a phone plug connector. In connector 1310 for example, the top of a right angle connector body features a knob 1312 concentric with the sleeve of the plug and coupled to the shaft of a potentiometer inside the connector body. It is contemplated that an embodiment that uses a potentiometer may also use a particular type of control knob resembling that of the instrument amplifier and may be otherwise aesthetically designed to complement the appearance of the amplifier. With connector 1320, a thumbwheel 1322 is shown to be exposed through cutout portion of the shell of the connector, resulting in a compact design that is easily adjusted by hand. The thumbwheel 1322 may be coupled to the shaft of a potentiometer built inside the connector. The potentiometer may be positioned so that the rotation of its wiper is roughly concentric with the plug. In the case of connector 1330, a molded right angle connector, including a grip portion 1334 and a strain relief 1336, is formed around the plug and the cable and further houses a potentiometer and a slotted knob 1332 connected to the potentiometer. The molded portion may include index markings to facilitate setting the potehtiometer to a desired value or position. Of course, potentiometers or switches may be integrated or housed elsewhere in an attenuator device, such as in block 408 of device 434, shown earlier.

Figure 14:
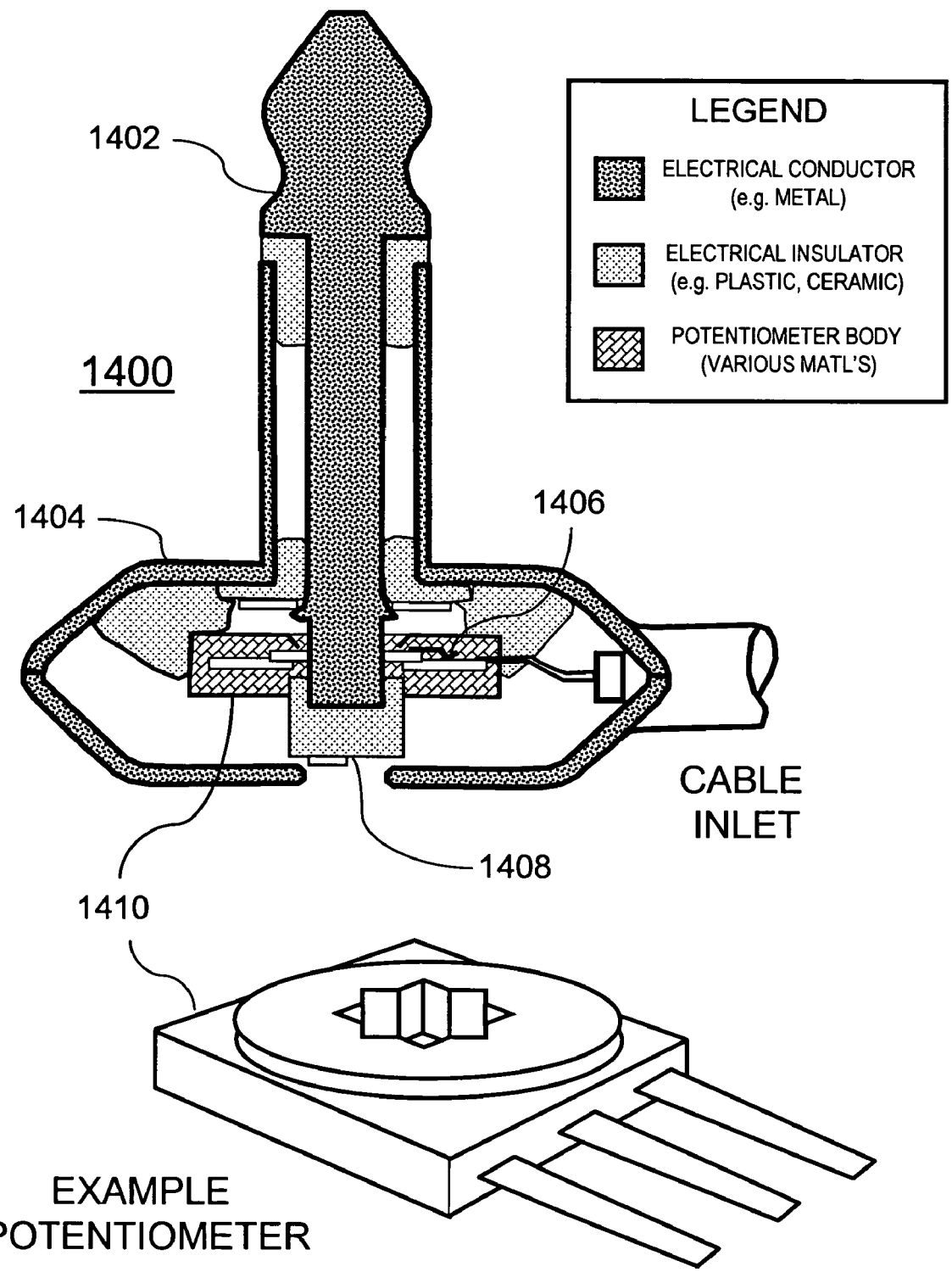
FIG. 14 illustrates a connector with an integral potentiometer or switch control wherein a concentric conductor of the connector is mechanically coupled to adjust the wiper of the potentiometer in accordance with an exemplary embodiment of the present invention.

FIG. 14 depicts yet another variation for integrating a potentiometer into a connector. Connector 1400 is arranged such that the central 'tip' conductor of the plug also serves as a knob by which to adjust a potentiometer in the main body of the connector. When connector 1400 is removed from a jack, a user may grasp the tip conductor 1402 and rotate it with respect to the connector shell 1404. This causes the movable wiper 1406 of a potentiometer 1410 to turn, thereby changing the setting of the potentiometer and affecting the attenuation ratio of the attenuation device as described earlier. Optionally, a viewing window and/or an indicator dial 1408 may be provided that is visible from the 'back' or outward portion of the connector to facilitate the user setting the potentiometer to a specific desired setting or readily examining the setting of the potentiometer even when it is plugged into a connector jack. Electrical connection to the tip conductor 1402 may be provided by a separate wiper (not explicitly shown) as will be readily understood to those of ordinary skill in the art. For clarity, an example potentiometer 1410 that may be used is shown separately in FIG. 14. Examples of commercial potentiometers similar to this are the PANASONIC™ EVN-D2A, CTS™ Models U201 or U262, and the BOURNS™ 3319W-2. The arrangement of FIG. 14 may be useful in applications where adjustments to the device are intended to be made only once or very infrequently.

Figure 15:
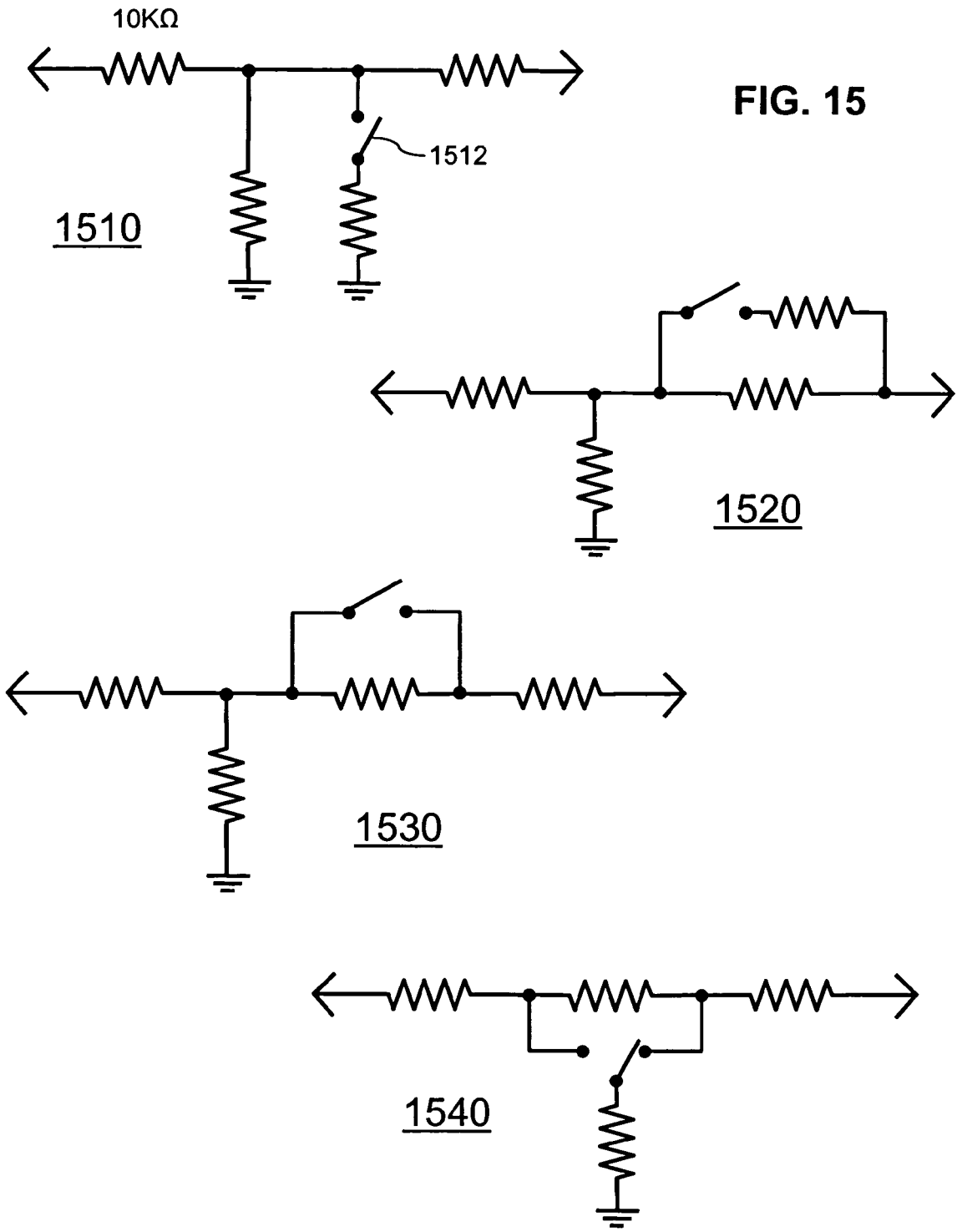
FIG. 15 provides electrical schematic diagrams of attenuators having attenuation characteristics variable by the actuation of electrical switches in accordance with exemplary embodiments of the present invention.

As an alternative to designs involving potentiometers, FIG. 15 depicts several arrangements involving switches. A variety of switchable arrangements are depicted schematically in FIG. 15. Those of ordinary skill in the art will readily understand the operating principles and design aspects of the various embodiments shown, especially in view of teachings of the potentiometer-based arrangements herein. In the various configurations in FIG. 15, switches are used in combination with resistor values to implement stepwise-variable resistance elements at various points in the circuit and, therefore, stepwise changes in the attenuation characteristics of the overall circuit.

In practice, the switches may be of any design, such as microswitches, DIP switches, toggle switches, rotary switches, mercury switches, magnetic reed switches, relays, optical switches, etc. As with the potentiometer configurations shown above, switches may be incorporated into connectors or cables and be actuated and observed by the end user. Although simple switches are shown in FIG. 15, it will be readily understood by those of ordinary skill in the art that multi-pole and multi-throw switches, such as rotary selector switches, can certainly be used to achieve more variety in the operation of the attenuation device. In particular, the topmost arrangement shown (circuit 1510) provides for four different attenuation values depending on whether switch 1512 is open or closed and the direction in which the circuit is inserted between a preamplifier and a power amplifier. Using the values shown, the circuit will provide attenuation ratios of 92, 46, 10 and 5.5, which covers a wide range of practical applications. Alternative circuits 1520, 1530 and 1540 may also be designed and configured to provide desirable operation in certain applications.

In many models of instrument amplifiers, the preamplifier portion provides two (or more) 'channels' and the user may switch between the two channels to change the sound of the amplified signal. Switching between channels is often used by guitarists to shift from an undistorted sound to a more prominent distorted sound well suited for 'lead' melodies. The switching may be used to change the sound of the guitar from one song to the next without having to adjust the amplifier controls. The switching may also be used during a song to shift between a clean rhythm guitar part and a distorted lead guitar part. For example, a Princeton Chorus amplifier made by FENDER™ provides a 'clean' channel, having a first volume control associated therewith, and an 'overdrive' channel having a second volume control, as well as input gain and limiter controls. A user may use a switch on the front panel or a separate foot-operated switch to switch between the two channels even while playing an instrument. The first and second volume controls operate entirely independently from one another. It is often desirable to adjust the two volume controls such that, when switching between the two channels, the sound level remains at approximately the same level. In some instances, the overdrive channel is intentionally set to be somewhat louder than the clean channel, coinciding with a guitar assuming a prominent lead part versus a more subtle rhythm part. Nevertheless, the sound levels are similar in magnitude.

With an instrument amplifier having two or more switchable channels as just described, the advantages of improved volume control offered by embodiments of the present invention become even more apparent and important. In such multi-channel arrangements, it can be difficult to approximately match the volumes of the channels, especially at low overall volume levels. This is because either of the volume controls taken alone is difficult to adjust at low levels. Thus, trying to adjust two or more erratic controls to achieve a desired relationship to one another can be particularly difficult. Inserting an attenuator cable between preamplifier and power amplifier in accordance with the present teachings greatly facilitates these relative settings by allowing both volume controls to be operated over a wider range of adjustment.

While various exemplary embodiments of the present invention have been shown and described by way of example thus far, these depictions should not be construed to be limiting as to the scope of the invention and it should be recognized that many variations are possible beyond what has been shown. For example, in the resistor attenuator networks shown, those of ordinary skill in the art will recognize that so-called 'pi-networks' or 'delta networks' may be alternatively used, but a '1-network' is considered advantageous its ease of design, greater diversity of directional attenuation ratios and for having predictable attenuation when reversed and under varying impedance characteristics of the external circuitry.

Having a continuous adjustment available via the preamp volume control means that providing a continuously variable second adjustment as part of the attenuator cable may not be necessary for many applications. A fixed or stepwise attenuation may be preferable over an adjustable control for some users because it allows a user to more consistently establish an approximate desired volume level by adjusting the preamp volume control knob to a particular setting. The user is relieved of having to consider the interplay between the volume control knob and a separate continuous control built into the attenuation device. However, the present invention does not necessarily exclude using continuously adjustable controls or using fixed, switchable or integral attenuation settings, or even a combination of both. In addition, those of ordinary skill in the art will recognize that additional electronic components may be integrated into an attenuation device, such as capacitors, inductors, filter circuits, etc. to perform other operations on an electrical signal.

While common quarter-inch phone plugs and jacks are depicted herein by way of example and are typical of electrical connectors found on instrument amplifiers, those of ordinary skill in the art will recognize that one may readily use other types of electrical connectors, such as the popular so-called "RCA phono" plugs and jacks, without deviating from the spirit and scope of the present invention.

Some instrument amplifiers and similar pieces of equipment employ stereo effects loops and use stereo phone plugs and phone jacks, each having an outer shield conductor plus two signal-carrying conductors. In the present description, wherever a monaural circuit is shown, it is understood that the stereo version of the circuit could easily be implemented by duplicating the monaural circuit for each channel of the stereo signal. Those of ordinary skill in the art will readily recognize how to adapt the present teachings to perform a similar function on stereo signals and using stereo connectors.

While various embodiments of the present invention have been shown and described by way of example in the preceding detailed description and accompanying drawings, these examples should not construed to limit the invention in any way. As those of ordinary skill in the art will recognize, many variations are readily achievable beyond those explicitly shown herein and without departing from the spirit and scope of the present invention as indicated in the appended claims.

No aspect, attribute, component or arrangement thereof used in the description of the present application should be construed as critical or essential to the invention unless explicitly described as such. Also, as used herein, the article "a" is intended to include one or more items. Where only one item is intended, the term "one" or similar language is used. The scope of the invention is defined by the claims which follow and their equivalents.

What is claimed is:

1. An apparatus configured to be removably coupled to an electronic audio frequency amplifier, the electronic audio frequency amplifier comprising a preamplifier and a power amplifier and having a first electrical connector coupled to the output of the preamplifier and having a second electrical connector coupled to the input of the power amplifier, the apparatus comprising:

a third electrical connector configured to be electrically coupled to the first electrical connector in accordance with a first usage configuration;

a fourth electrical connector configured to be electrically coupled to the second electrical connector in accordance with the first usage configuration; and an electrical attenuator circuit operating to receive an input voltage signal from the preamplifier via the third electrical connector and to provide via the fourth electrical connector an output voltage signal to the power amplifier that is proportional to the input voltage according to a first proportion factor and the first proportion factor is such that the output voltage signal is less than the input voltage signal;

wherein the apparatus is configured to also be used in accordance with a second usage configuration wherein the fourth electrical connector is electrically coupled to the first electrical connector and the third electrical connector is electrically coupled to the second electrical connector, and wherein, when the apparatus is used in accordance with the second usage configuration, the electrical attenuator circuit operates to receive the input voltage signal from the preamplifier via the fourth electrical connector and to provide via the third electrical connector an output voltage signal to the power amplifier that is proportional to the input voltage according to a second proportion factor, the second proportion factor being such that the output voltage signal is less than the input voltage signal; and wherein the first proportion factor is substantially different than the second proportion factor and wherein the user may selectively use either the first proportion factor or the second proportion factor by connecting the apparatus to the electronic audio frequency amplifier in accordance with either the first usage configuration or the second usage configuration, respectively.

2. The apparatus of claim 1 wherein the apparatus bears indicia indicating to a user how the apparatus is to be connected to selectively obtain voltage signal reduction according to either the first proportion factor by accomplishing the first usage configuration or according to the second proportion factor by accomplishing the second usage configuration.

3. The apparatus of claim 2 wherein the indicia distinguishes the third electrical connector from the fourth electrical connector.

4. The apparatus of claim 1 wherein the electrical attenuator circuit is designed with regard for the impedances of the output of the preamplifier and the input of the power amplifier such that the first proportion factor is substantially independent of the second proportion factor.

5. The apparatus of claim 1 wherein the impedance of the electrical attenuator circuit as experienced by the preamplifier output is maintained greater than a given minimum impedance value in both the first and second usage configurations and wherein both the first proportion factor and second proportion factor are less than the ratio of the given minimum impedance divided by the sum of the given minimum impedance plus a characteristic impedance of the preamplifier output.

* * * * *